US009485880B2

(12) United States Patent
Jeong

(10) Patent No.: US 9,485,880 B2
(45) Date of Patent: Nov. 1, 2016

(54) ELECTRIC DEVICE FOR ELECTRIC VEHICLE

(71) Applicant: LSIS CO., LTD., Anyang-si, Gyeonggi-do (KR)

(72) Inventor: Han Uk Jeong, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 54 days.

(21) Appl. No.: 14/543,716

(22) Filed: Nov. 17, 2014

(65) Prior Publication Data

US 2015/0156896 A1    Jun. 4, 2015

(30) Foreign Application Priority Data

Dec. 4, 2013 (KR) .................. 10-2013-0150237

(51) Int. Cl.
| H05K 7/14 | (2006.01) |
| H05K 7/18 | (2006.01) |
| H05K 5/00 | (2006.01) |
| H01R 12/71 | (2011.01) |
| H05K 1/14 | (2006.01) |

(52) U.S. Cl.
CPC .......... *H05K 5/0047* (2013.01); *H01R 12/716* (2013.01); *H05K 1/144* (2013.01)

(58) Field of Classification Search
USPC ....... 361/796, 752, 728–739, 807, 809, 810, 361/792
See application file for complete search history.

(56) References Cited

U.S. PATENT DOCUMENTS

| 5,111,362 A * | 5/1992 | Flamm ................... H05K 7/142 220/4.02 |
| 5,461,542 A | 10/1995 | Kosak et al. |
| 6,249,442 B1 * | 6/2001 | Watanabe ............... H05K 7/142 174/138 E |
| 6,894,891 B2 * | 5/2005 | Darr ........................ H05K 7/142 361/601 |
| 7,619,900 B2 * | 11/2009 | McClure ............ H05K 7/20727 361/752 |
| 7,766,663 B2 * | 8/2010 | Yazawa ................ H01R 12/716 439/63 |

FOREIGN PATENT DOCUMENTS

| JP | 1987-160590 | 10/1987 |
| JP | 1992-103676 | 9/1992 |
| JP | 05-218669 | 8/1993 |
| JP | 5434757 | 3/2014 |
| KR | 10-2009-0022555 | 3/2009 |

OTHER PUBLICATIONS

Japan Patent Office Application Serial No. 2014-245882, Office Action dated Jul. 28, 2015, 3 pages.
Korean Intellectual Property Office Application Serial No. 10-2013-0150237, Office Action dated Sep. 23, 2014, 5 pages.
Korean Intellectual Property Office Application Serial No. 10-2013-0150237, Notice of Allowance dated Mar. 19, 2015, 2 pages.

* cited by examiner

*Primary Examiner* — Hung S Bui
(74) *Attorney, Agent, or Firm* — Lee, Hong, Degerman, Kang & Waimey; Jonathan Kang; Richard Salfelder

(57) ABSTRACT

An electric device for an electric vehicle is provided. The electric device includes a lower case, an upper case coupled to an upper portion of the lower case, a first printed circuit board (PCB) fixed to the lower case and comprising a first connector, and a second PCB fixed to the upper case and comprising a second connector. The first connector and the second connector are vertically disposed to correspond to each other, and the first connector is coupled to the second connector by coupling the lower case to the upper case to connect the first PCB to the second PCB.

11 Claims, 6 Drawing Sheets

ELECTRIC DEVICE FOR ELECTRIC VEHICLE

CROSS-REFERENCE TO RELATED APPLICATIONS

Pursuant to 35 U.S.C. §119(a), this application claims the benefit of earlier filing date and right of priority to Korean Patent Application No. 10-2013-0150237, filed on Dec. 4, 2013, the contents of which are all hereby incorporated by reference herein in its entirety.

BACKGROUND

The present disclosure relates to an electric device for an electric vehicle, and more particularly, to an electric device for an electric vehicle, in which two-layered printed circuit boards (PCBs) are simply and easily installed.

Recently, various electric devices are widely being used in various industrial fields.

For example, electric devices are being widely used in various eco-friendly vehicles such as electric vehicles, hybrid vehicles, plug-in hybrid vehicles, and fuel cell vehicles and also in various industrial and household internal fixed power electronics or portable power electronics.

Such an electric device has a task on minimization in volume, weight lightening, cost reduction, and simplification in assembly process.

Thus, when an electric device includes one or more printed circuit boards (PCBs), it is necessary to consider efficiency of space availability and easy of assembly in disposing of the PCBs.

FIG. 1 is a schematic plan view illustrating a portion of an electric device including two printed circuit boards (PCBs) according to a related art.

Referring to FIG. 1, a plurality of upper PCB coupling parts 11 that protrude upward are disposed on a lower case 10. Then, a lower PCB 20 is disposed between the upper PCB coupling parts 11 without overlapping the upper PCB coupling parts 11. Thus, each the upper PCB coupling parts 11 has an upper end higher than the lower PCB 20.

An upper PCB (not shown) is disposed on the upper PCB coupling part 11 and fixed to the upper PCB coupling part 11 by a bolt.

Also, the upper PCB is connected to the lower PCB 10 by a connector and wire.

The lower case 10 is coupled to the upper case (not shown) by the bolt coupled to a case coupling hole 12 defined along an edge thereof.

In order to form this structure, the upper PCB coupling part 11 for coupling the upper PCB (not shown) to the lower case 10 has to be provided in plurality. Thus, the lower PCB may be limited in space. This is because the lower PCB 20 is reduced in area at portions in which the upper PCB coupling parts 11 are disposed.

Also, an upper space of the lower PCB 20 is limited in availability due to the wire connecting the lower PCB 20 to the upper PCB.

Also, when the lower PCB is installed in a place accompanying a lot of vibration such as an electric vehicle, the electric vehicle is likely to cause malfunction because the connector connected to the PCB is separated.

Also, the electric device increases in assembly process number and manufacturing costs.

SUMMARY

Embodiments provide an electric device for an electric vehicle, in which two-layered printed circuit boards are efficiently and simply installed.

In one embodiment, an electric device for an electric vehicle includes: a lower case; an upper case coupled to an upper portion of the lower case; a first printed circuit board (PCB) fixed to the lower case and comprising a first connector; and a second PCB fixed to the upper case and comprising a second connector, wherein the first connector and the second connector are vertically disposed to correspond to each other, and the first connector is coupled to the second connector by coupling the lower case to the upper case to connect the first PCB to the second PCB.

The details of one or more embodiments are set forth in the accompanying drawings and the description below. Other features will be apparent from the description and drawings, and from the claims.

DETAILED DESCRIPTION OF THE EMBODIMENTS

Figure 1:
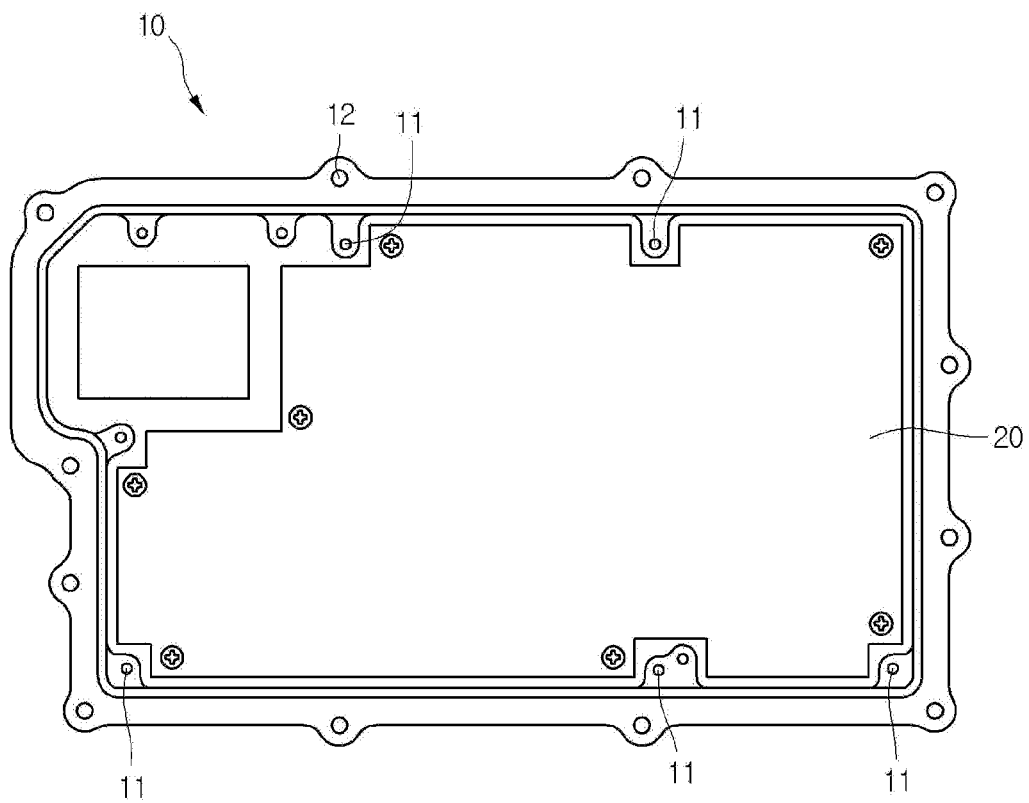
FIG. 1 is a schematic plan view illustrating an example of an electric device according to a related art.

Reference will now be made in detail to the embodiments of the present disclosure, examples of which are illustrated in the accompanying drawings.

An electric device for an electric vehicle according to an embodiment will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

In the descriptions of embodiments, it will be understood that when a layer (or film), a region, a pattern, or a structure is referred to as being 'on/above/over/upper' board or 'under/below/lower', the 'on/above/over/upper' board and 'under/below/lower' comprise each layer (or film), a region, a pad, or patterns, which can be directly formed on board as well as each layer (or film), the region, the pad, or the patterns, which can be indirectly formed under another layer (film), another region, another pad, or another patterns, with one or more intervening layers may also being present. Therefore, meaning thereof should be judged according to the spirit of the present disclosure.

Thickness or size of each layer in the drawings has been exaggerated, omitted, or roughly illustrated for the convenience and clarity of the description. Further, sizes of the respective components do not entirely reflect actual sizes thereof.

Hereinafter, an electric device for an electric vehicle according to an embodiment will be described with reference to the accompanying drawings.

Figure 2:
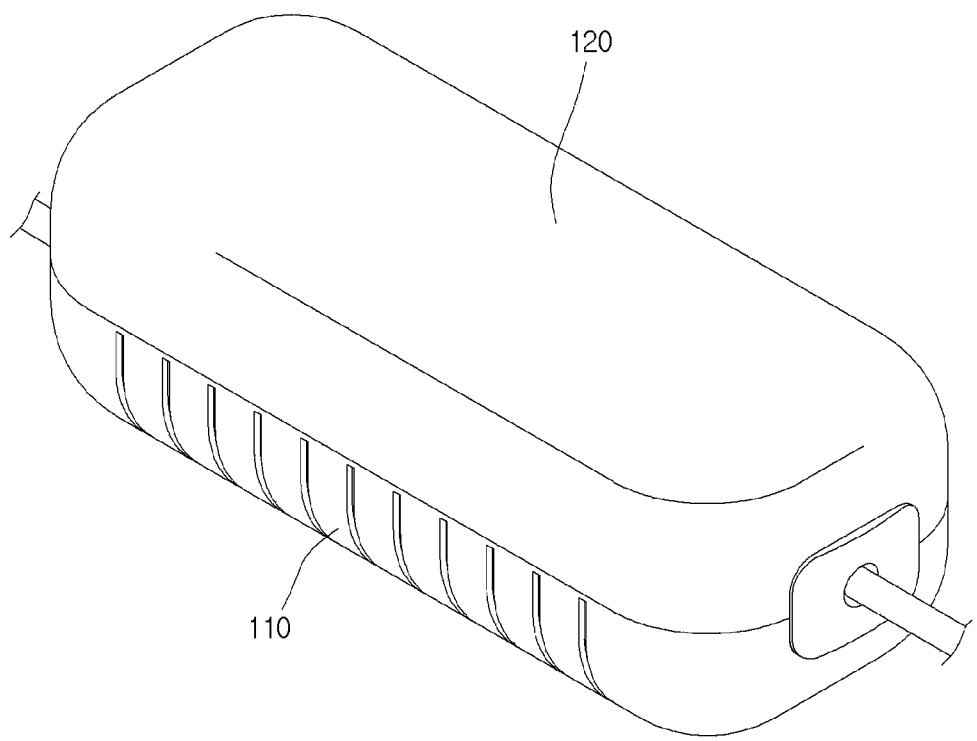
FIG. 2 is a perspective view of an electric device for an electric vehicle according to an embodiment.

FIG. 2 is a perspective view of an electric device for an electric vehicle according to an embodiment. The exemplary electric device according to the current embodiment may be an electric device used in charging of electric vehicles. However, the scope of the present disclosure is not limited to the electric device that relates to the charging of the electric vehicles. That is, if the electric device is a device that relates to an operation of the electric vehicle, the present disclosure is not separately limited.

Referring to FIG. 2, the electric device for the electric vehicle according to an embodiment includes a lower case 110 and an upper case 120.

Figure 3:
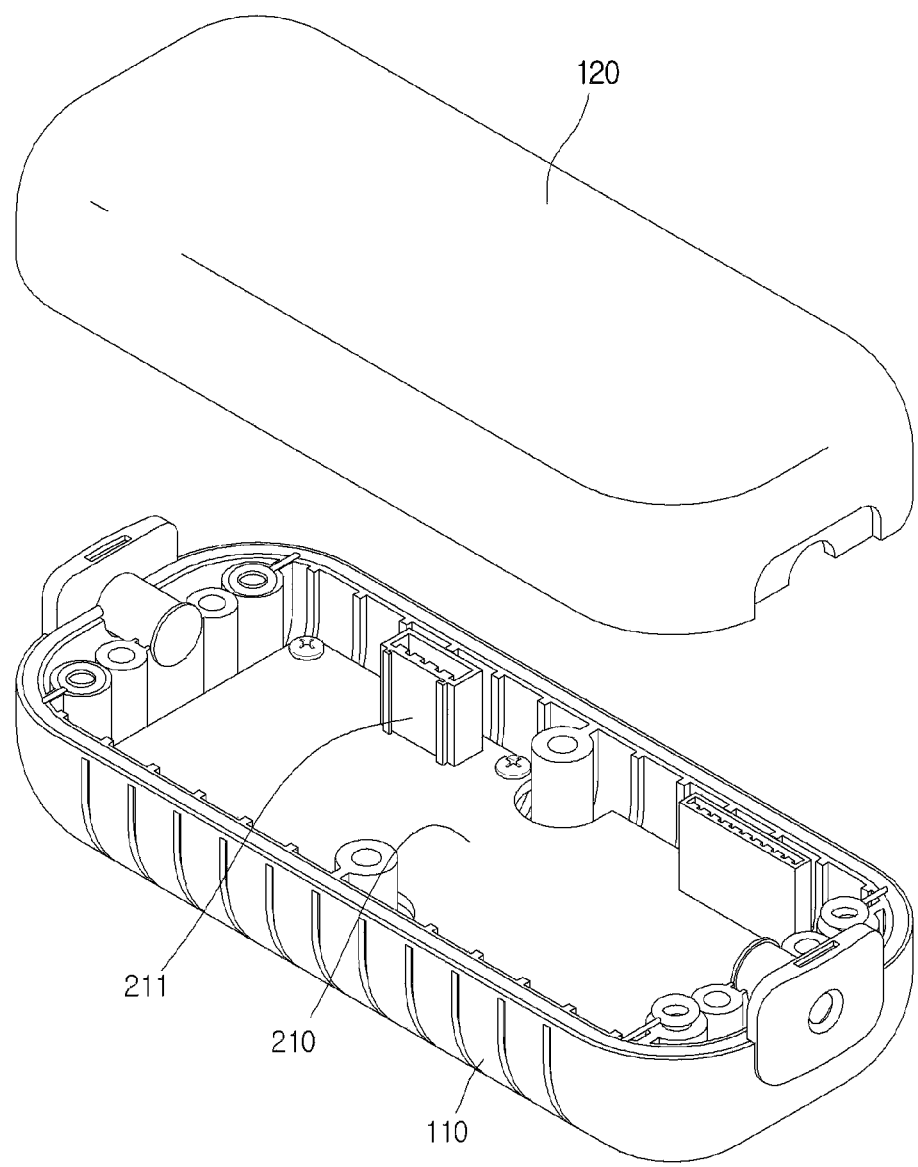
FIG. 3 is an exploded perspective view of the electric device for the electric vehicle according to an embodiment.
Figure 4A:
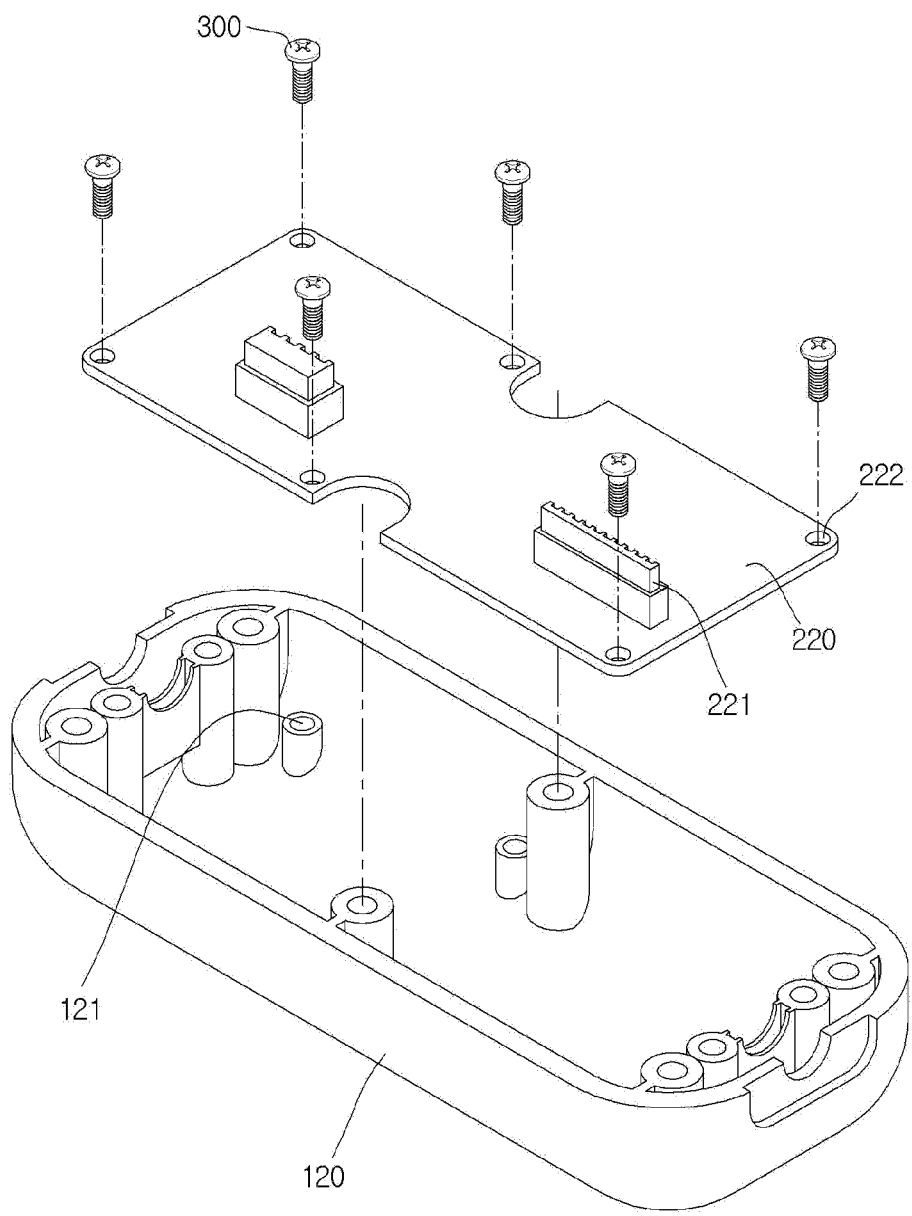
FIG. 4a is an exploded perspective view of a lower case.
Figure 4B:
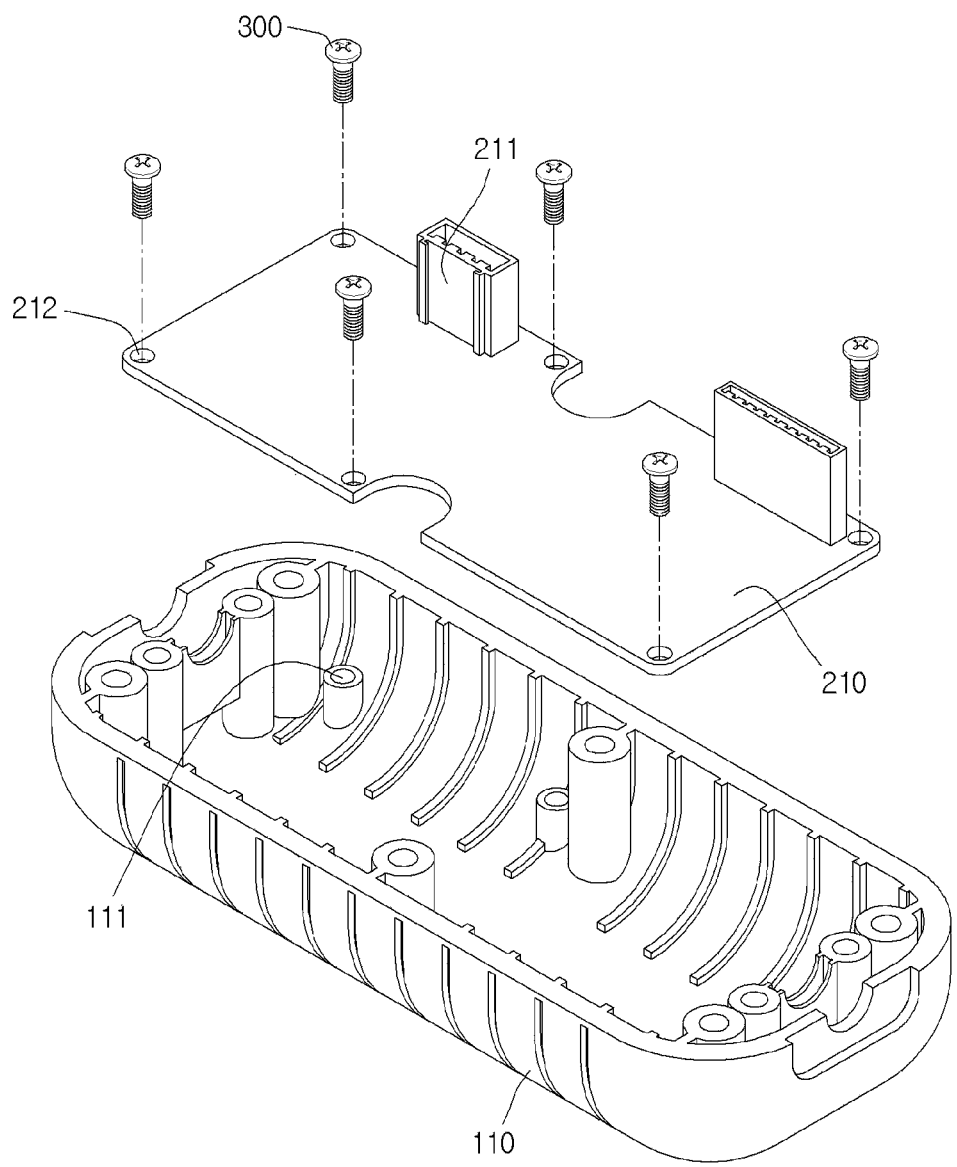
FIG. 4b is an exploded perspective view of an upper case.

FIG. 3 is an exploded perspective view of the electric device for the electric vehicle according to an embodiment, FIG. 4a is an exploded perspective view of a lower case, and FIG. 4b is an exploded perspective view of an upper case.

Referring to FIGS. 3 to 4b, the lower case 110 has an edge that is bent to extend upward. Thus, a space in which various electrical and electronic components are installed is defined inside the edge.

Particularly, referring to FIG. 4b, a first printed circuit board (PCB) mounting part 111 may be disposed in the lower case 110. A first PCB 210 that will be described later may be mounted on the first PCB mounting part 111. The first PCB mounting part 111 protrudes upward to extend and has a bolt coupling groove to which the bolt is coupled. The bolt coupling groove has an opened upper end and is recessed downward. Also, a screw thread is formed on an inner circumferential surface of the bolt coupling groove.

The upper case 120 may be coupled to an upper portion of the lower case 110. The upper case 120 has an edge that is bent to extend downward. The upper case 120 has a lower end edge having a shape corresponding to that of an upper end edge of the lower case 110. That is, when the lower case 110 is coupled to the upper case 120, the lower end edge of the upper case 120 and the upper end edge of the lower case 110 have the same shape so that the upper end edge of the lower case 110 contacts the lower end edge of the upper case 120. Thus, a space in which various electrical and electronic components are installed is defined inside the edge of the upper case 120.

Referring to FIG. 4a, a second PCB mounting part 121 is disposed in the upper case 120. A second PCB 220 that will be described later may be mounted on the second PCB mounting part 121. The second PCB mounting part 121 protrudes downward to extend and has a bolt coupling groove to which the bolt is coupled. The bolt coupling groove has an opened lower end and is recessed upward. Also, a screw thread is formed on an inner circumferential surface of the bolt coupling groove.

The first PCB 210 is coupled to the lower case 110. A plurality of through-holes 212 are defined in the first PCB 210. Each of the plurality of through-holes 212 vertically passes through the first PCB 210 to correspond to that of the above-described first PCB mounting part 111. Thus, since a bolt 300 passes through the through-hole 212 and then is coupled to the first PCB mounting part 111, the lower case 110 is fixed to the first PCB 210. The first PCB 210 is disposed lower than an edge of the lower case 110.

A first connector 121 is disposed on the first PCB 210. The first connector 211 may be a female connector or a male first connector. When the first connector 211 is a female connector, a second connector 221 that will be described later is a male connector, and when the first connector 211 is a male connector, the second connector 211 that will be described later is a female connector.

The second PCB 220 is coupled to the upper case 120. A plurality of through-holes 222 are defined in the second PCB 220. Each of the plurality of through-holes 222 vertically passes through the second PCB 220 to correspond to that of the above-described second PCB mounting part 121. Thus, since a bolt 300 passes through the through-hole 222 and then is coupled to the second PCB mounting part 121, the upper case 120 is fixed to the second PCB 220. The second PCB 220 is disposed lower than an edge of the upper case 120.

A second connector 221 is disposed on a bottom surface of the second PCB 220. The second connector 221 may be a female connector or a male connector.

Figure 5:
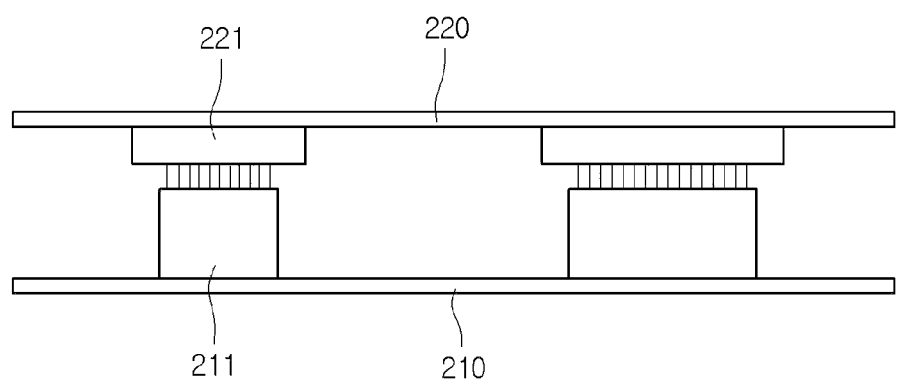
FIG. 5 is a schematic side view of first and second printed circuit boards.

The first and second connectors 211 and 221 may constitute a board to board connector in which the first and second connectors 211 and 221 are directly connected to each other without using a separate wire or cable. Thus, the first and second connectors 211 and 221 are disposed at positions vertically corresponding to each other. That is, when viewed from above, the first connector 211 overlaps the second connector 221. Thus, when the lower case 110 is coupled to the upper case 120, the first connector 211 is naturally connected to the second connector 221 as illustrated in FIG. 5. For reference, FIG. 5 is a schematic side view illustrating a state where the first PCB is coupled to the second PCB in the board to board coupling manner.

Hereinafter, a method for assembling the electric device for the electric vehicle including the above-described constitutions will be described.

The first PCB 210 is fixed to the inside of the lower case 110.

In order to fix the first PCB 210 to the lower case 110, the first PCB 210 is disposed on the first PCB mounting part 111 disposed in the lower case 110. Here, the through-hole 212 defined in the first PCB 210 is vertically aligned with the first PCB mounting part 111.

Then, the bolt 300 is coupled thereto. The bolt 300 passes through the through-hole 212 defined in the first PCB 210 and is screw-coupled to the first PCB mounting part 111 disposed in the lower case 110.

Then, the second PCB 220 is fixed to the upper case 120.

In order to fix the second PCB 220 to the upper case 120, the second PCB 220 is disposed on the second PCB mounting part 121 disposed in the upper case 120. Here, the through-hole 222 defined in the second PCB 220 is vertically aligned with the second PCB mounting part 121.

Then, the bolt 300 is coupled thereto. The bolt 300 passes through the through-hole 222 defined in the second PCB 220 and is screw-coupled to the second PCB mounting part 121 disposed in the upper case 120.

Then, the lower case 110 and the upper case 120 are coupled to each other. In the process in which the lower case 110 is coupled to the upper case 120, the first connector 211 protruding upward from the first PCB 210 is directly coupled to the second connector 221 protruding downward from the second PCB 220. That is, the first and second connectors 211 and 221 are coupled to each other in board to board manner.

Here, the lower case 110 may be coupled to the upper case 120 by a separate bolt. Alternatively, the lower case 110 may be hook-coupled to the upper case 120. Also, although a separate constitution for coupling the lower case 110 and the upper case 120 to each other is not provided, the first and second connectors 211 and 221 have a strong coupling force therebetween, and thus the lower case 110 may be coupled to the upper case 120 by coupling the first connector 211 to the second connector 221.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric device for an electric vehicle, the electric device comprising:
   a lower case;
   an upper case coupled to an upper portion of the lower case;
   a first printed circuit board (PCB) fixed to the lower case and comprising a first connector; and
   a second PCB fixed to the upper case and comprising a second connector, wherein the first connector and the second connector are vertically disposed to correspond to each other,
   wherein the first connector is coupled to the second connector by coupling the lower case to the upper case to connect the first PCB to the second PCB,
   wherein a first PCB mounting part protruding upward is disposed on the lower case,
   wherein a first through-hole vertically passes through the first PCB and corresponds to the first PCB mounting part,
   wherein a second PCB mounting part protruding downward is disposed on the upper case,
   wherein a second through-hole vertically passes through the second PCB and corresponds to the second PCB mounting part,
   wherein the first PCB mounting part has a first bolt coupling groove that has an opened upper end and is recessed downward,
   wherein a first screw thread is formed on an inner circumferential surface of the first bolt coupling groove,
   wherein a first bolt passes through the first through-hole and is coupled to the first bolt coupling groove,
   wherein the second PCB mounting part has a second bolt coupling groove that has an opened lower end and is recessed upward,
   wherein a second screw thread is formed on an inner circumferential surface of the second bolt coupling groove, and
   wherein a second bolt passes through the second through-hole and is coupled to the second bolt coupling groove.

2. The electric device according to claim 1, wherein the first connector protrudes upward from the first PCB and the second connector protrudes downward from the second PCB.

3. The electric device according to claim 1, wherein the first connector comprises one of a female and male connector pair and the second connector comprises the other one of the female and male connector pair.

4. The electric device according to claim 1, wherein the first PCB has a shape corresponding to a shape of the second PCB.

5. The electric device according to claim 1, wherein the lower case has an edge that is bent to extend upward and the upper case has an edge that is bent to extend downward.

6. The electric device according to claim 5, wherein the upper case has a lower end edge with a shape corresponding to a shape of an upper end edge of the lower case.

7. The electric device according to claim 5, wherein the first PCB is disposed at a position lower than a position of the edge of the lower case.

8. The electric device according to claim 5, wherein the second PCB is disposed at a position higher than a position of the edge of the upper case.

9. The electric device according to claim 1, wherein the first connector is electrically connected to the second connector without using a cable.

10. The electric device according to claim 1, wherein the first connector is disposed on a top surface of the first PCB and the second connector is disposed on a bottom surface of the second PCB.

11. The electric device according to claim 1, wherein the lower case is hook-coupled to the upper case.

* * * * *